United States Patent
Defay et al.

(10) Patent No.: US 9,190,599 B2
(45) Date of Patent: Nov. 17, 2015

(54) PROCESS FOR FABRICATING AN OPTIMALLY-ACTUATING PIEZOELECTRIC MEMBRANE

(75) Inventors: Emmanuel Defay, Voreppe (FR); Gwenaël Le Rhun, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 785 days.

(21) Appl. No.: 12/881,955

(22) Filed: Sep. 14, 2010

(65) Prior Publication Data
US 2011/0061215 A1 Mar. 17, 2011

(30) Foreign Application Priority Data

Sep. 15, 2009 (FR) ...................................... 09 04396

(51) Int. Cl.
*H01L 41/31* (2013.01)
*H01L 41/08* (2006.01)
(Continued)

(52) U.S. Cl.
CPC .......... *H01L 41/0973* (2013.01); *H01L 41/053* (2013.01); *H01L 41/25* (2013.01);
(Continued)

(58) Field of Classification Search
CPC . H01L 41/047; H01L 41/053; H01L 41/0973; H01L 41/25; H01L 41/29; H01L 41/43; H01L 41/47; H01L 41/314; H01L 41/317; H01L 41/318; B41J 2/14233; B41J 2/161; Y10T 29/42; Y10T 29/49155; Y10T 29/49156; Y10T 29/49401
USPC .............. 29/25.35, 890.1, 846, 847; 310/321, 310/324, 357, 359; 347/68, 70; 252/62.9 PZ; 216/13, 94
See application file for complete search history.

(56) References Cited

U.S. PATENT DOCUMENTS 5,874,126 A * 2/1999 Kahn et al. ............... 29/25.35 X
6,349,455 B1 * 2/2002 Yun et al. .................. 29/25.35
(Continued)

FOREIGN PATENT DOCUMENTS

EP 0810676 A1 12/1997
GB 2444184 A 5/2008
(Continued)

OTHER PUBLICATIONS

P. Muralt, et al., "Fabrication and characterization of PZT thin-film vibrators for micromotors," Sensors and Actuators A 48, pp. 157-165, Jan. 26, 1995.
(Continued)

*Primary Examiner* — A. Dexter Tugbang
(74) *Attorney, Agent, or Firm* — Baker Hostetler LLP

(57) ABSTRACT

In a process for fabricating a membrane, including, on a substrate, a thin-film multilayer including a film of piezoelectric material placed between a top electrode film and a bottom electrode film and an elastic film supporting said piezoelectric film, the process includes: determining at least one concavity/convexity curvature of said membrane along an axis parallel to the plane of the films so that at least one inflection point is defined, said point allowing a first region and a second region, corresponding to a concave part and a convex part or vice versa, to be isolated; depositing, on the surface of the substrate, a thin-film multilayer including at least one film of piezoelectric material, one bottom electrode film and one top electrode film; and structuring at least one of the electrode films to define at least said first membrane region, in which an electric field perpendicular to the plane of the films may be applied, and at least said second region, in which an electric field parallel to the plane of the films may be applied.

22 Claims, 9 Drawing Sheets

(51) Int. Cl.

| | | |
|---|---|---|
| *H01L 41/09* | (2006.01) | |
| *H01L 41/053* | (2006.01) | |
| *H01L 41/25* | (2013.01) | |
| *H01L 41/43* | (2013.01) | |
| *H01L 41/317* | (2013.01) | |
| *H01L 41/47* | (2013.01) | |
| *H01L 41/29* | (2013.01) | |
| *H01L 41/318* | (2013.01) | |
| *H01L 41/314* | (2013.01) | |
| *B41J 2/14* | (2006.01) | |
| *B41J 2/16* | (2006.01) | |
| *H01L 41/047* | (2006.01) | |

(52) U.S. Cl.
CPC ............. *H01L 41/29* (2013.01); *H01L 41/317* (2013.01); *H01L 41/318* (2013.01); *H01L 41/43* (2013.01); *H01L 41/47* (2013.01); *B41J 2/14233* (2013.01); *B41J 2/161* (2013.01); *H01L 41/047* (2013.01); *H01L 41/314* (2013.01); *Y10T 29/42* (2015.01); *Y10T 29/49155* (2015.01); *Y10T 29/49156* (2015.01); *Y10T 29/49401* (2015.01)

(56) References Cited

U.S. PATENT DOCUMENTS

| | | | |
|---|---|---|---|
| 6,419,848 B1 * | 7/2002 | Qiu et al. | 252/62.9 PZ X |
| 7,067,955 B2 * | 6/2006 | Higuchi et al. | 29/25.35 X |
| 2005/0134144 A1 | 6/2005 | Buhler et al. | |
| 2005/0185026 A1 | 8/2005 | Noguchi et al. | |
| 2006/0020918 A1 | 1/2006 | Mosberger | |
| 2006/0290748 A1 * | 12/2006 | Shimada | 347/68 |
| 2008/0074471 A1 * | 3/2008 | Sakashita et al. | 347/68 |
| 2008/0239020 A1 | 10/2008 | Sugahara | |
| 2009/0289998 A1 * | 11/2009 | Tanaka et al. | 347/68 |

FOREIGN PATENT DOCUMENTS

| | | | |
|---|---|---|---|
| JP | 61252799 A | * | 11/1986 |
| WO | 03079409 | | 9/2003 |
| WO | 2007112741 | | 10/2007 |

OTHER PUBLICATIONS

Seo, et al., "Micromachined Piezoelectric Microspeakers Fabricated with High Quality AlN Thin Film," Integrated Ferroelectrics, 95, pp. 74-82, Sep. 30, 2007.

* cited by examiner

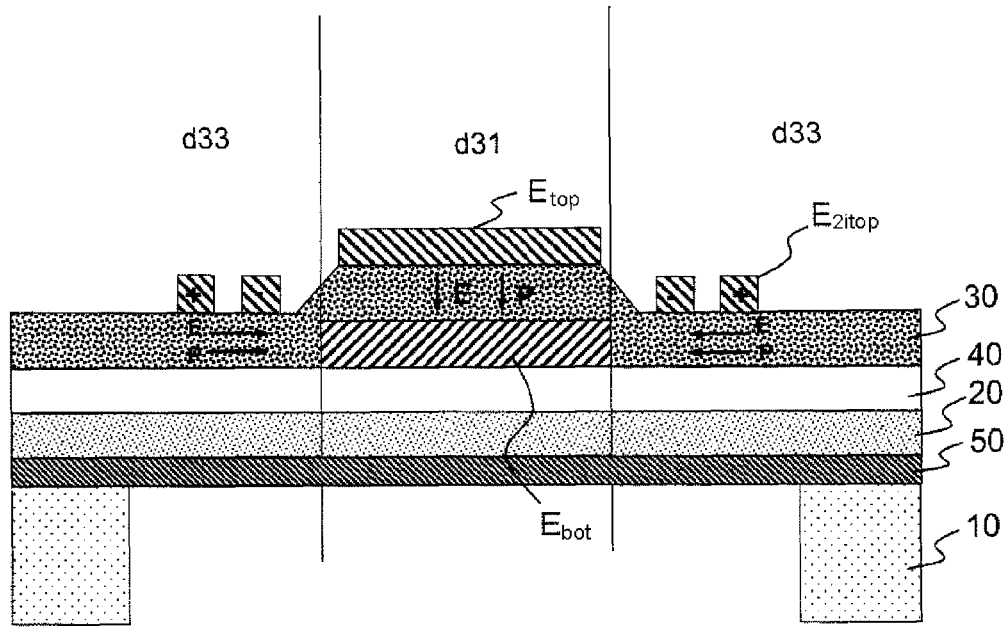
FIG.11
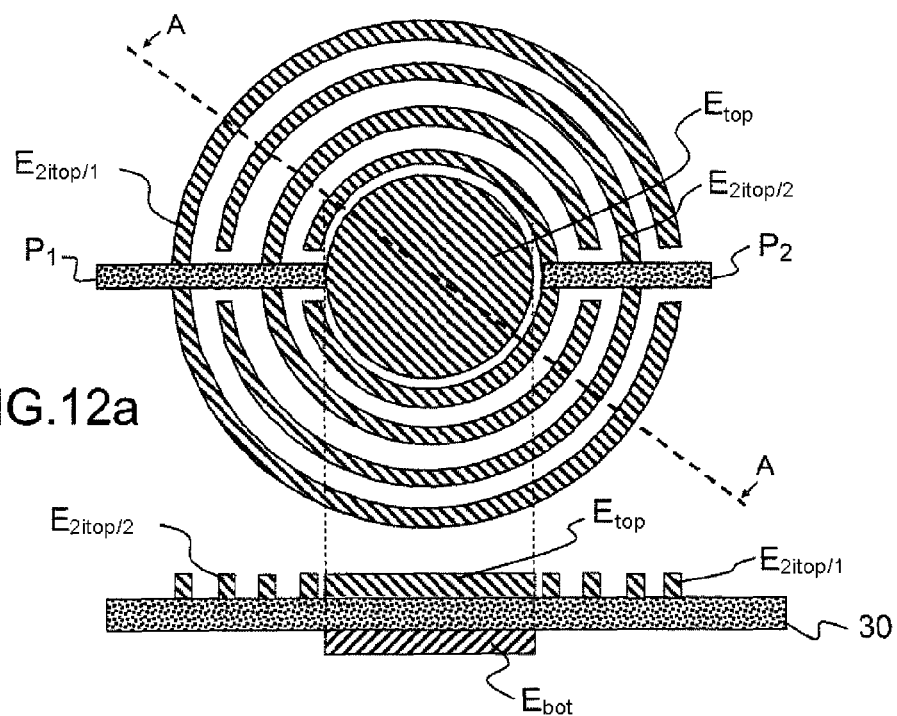
FIG.12a
FIG.12b

PROCESS FOR FABRICATING AN OPTIMALLY-ACTUATING PIEZOELECTRIC MEMBRANE

CROSS-REFERENCE TO RELATED APPLICATION

This application claims priority to foreign French patent application No. FR 09 04396, filed on Sep. 15, 2009, the disclosure of which is incorporated by reference in its entirety.

FIELD OF THE INVENTION

The invention relates to the microsystem field and more particularly to membranes that may be used in micropumps or even in piezoelectric actuators for inkjet printers.

BACKGROUND OF THE INVENTION

Currently, thin-film piezoelectric membranes are known that use films of piezoelectric materials such as lead zirconate titanate (PZT) or an alloy of aluminium nitride (AlN), described in the United States patent application US 2006/0209128. The membranes may operate in two possible actuation modes: the $d_{31}$ or the $d_{33}$ mode.

Generally, the following equations give the coefficients $d_{31}$ and $d_{33}$ as a function of the strain of a material of polarization P in an electric field applied to the material:

$$d_{31}=S_1/E_3$$

$$d_{33}=S_3/E_3$$

with $S_1$ corresponding to the strain along the axis 1, $S_3$ corresponding to the strain along the axis 3 and $E_3$ corresponding to the electric field along the axis 3 (as shown in FIG. 1).

The operating modes depend on the direction in which the material is polarized and on the direction in which an actuating electric field is applied. FIGS. 2a and 2b thus show two typical actuating structures with coefficients $d_{31}$ and $d_{33}$. In a $d_{31}$ mode, the voltage is applied between the top electrode and the bottom electrode as shown in FIG. 2a. In the case of the $d_{33}$ mode, the voltage is applied between the top electrodes, denoted + and − in FIG. 2b.

More precisely, the structure comprises a membrane on the surface of a substrate 1, said membrane comprising a deformable piezoelectric film 3 on the surface of an elastic film 2 and furthermore actuating electrodes. In the case shown in FIG. 2a, the actuating electrodes are a bottom electrode $E_{bot}$ and a top electrode $E_{up}$, between which are sandwiched the films 2 and 3. In the case of FIG. 2b the top control electrodes are denoted $E_{itop}$.

In operation, the membrane has a non-monotonic profile— that is to say that the curvature is, at a given moment, convex in certain places and concave in others. Muralt has shown (P. Muralt, M. Kohli, T. Maeder, A. Kholkin, K. Brooks, N. Setter and R. Luthier, Sensors and Actuators A, 48(2), 157 (1995)) that the profile is roughly that shown in FIG. 3, which figure shows the curvature profile of a hybrid elastic film/piezoelectric film membrane. The abscissa x=0 corresponds to the position of the centre of the membrane and the abscissa x=0.001 corresponds to the edge of the membrane in the fixed or immobilized region.

Thus, whether the membrane operates in the d33 or the d31 regime, actuating the piezoelectric material all over the membrane is counterproductive since it is essential that the piezoelectric material is made to operate identically in a curvature region of the same sign.

For a non-ferroelectric piezoelectric material unpolarized by the electric field (e.g. AlN, ZnO or quartz), the in-plane strain $S_p$ is given by the following equation (1):

$$S_p = d_{31}E = -d_{31}\frac{V}{e_p} \tag{1}$$

with $e_p$ being the thickness of the piezoelectric material and V the applied voltage.

It should be noted, as notably described in the paper by KyongWon Seo, JongSeon Park, HyongJung Kim et al.: Micromachined piezoelectric microspeakers fabricated with high quality AlN thin films, published in Integrated Ferroelectrics, 95 (74-82), pp. 74-82 (2007), that in the case of certain currently used crystalline materials, such as AlN, the sign of the coefficient $d_{31}$ depends on the crystal orientation of the material. Thus, when the polarization direction of the AlN material is turned as shown in FIG. 2a, the coefficient $d_{31}$ is negative.

It is this piezoelectric strain that causes a piezoelectric moment that deflects the membrane.

It is known to exploit a change in sign of the piezoelectric excitation, in an AlN-type material, by two separate top electrodes placed between the centre of the membrane and the edge of the membrane as shown in FIGS. 4a and 4b, which show a top view and a cross-sectional view, respectively, of a structure in which the two regions of the membrane of different curvature are excited simultaneously. Here, a $d_{31}$ actuation is used in both regions but the sign of the applied voltage is reversed.

The voltages are applied between the top electrodes $E_{itop}$ and the bottom electrode $E_{bot}$ which remains grounded. Piezoelectric moments of different sign can therefore be applied to the convex and concave regions of the membrane, thus improving the actuation.

SUMMARY OF THE INVENTION

In this context, the present invention provides a solution allowing an optimal deflection to be obtained by using a hybrid—d31 and d33—actuation in the two regions of different curvature of the actuated membrane, said solution being moreover compatible with the use of ferroelectric piezoelectric materials which advantageously can be repolarized.

More precisely, the subject of the present invention is a process for fabricating a membrane comprising, on a substrate, a thin-film multilayer comprising at least:
  a film of piezoelectric material placed between a top electrode film and a bottom electrode film and
  an elastic film supporting said piezoelectric film, characterized in that the process comprises the following steps:
  firstly, determining at least one concavity/convexity curvature of said membrane along an axis parallel to the plane of the films so that at least one inflection point is defined, said point allowing a first region and a second region, corresponding to a concave part and a convex part or vice versa, to be isolated;
  depositing, on the surface of the substrate, a thin-film multilayer comprising at least one film of piezoelectric material, one bottom electrode film and one top electrode film; and structuring at least one of the electrode films so as to define at least said first membrane region, in which an electric field perpendicular to the plane of the films may be applied, and at least said second region, in which an electric field parallel to the plane of the films may be applied.

According to a variant of the invention, all the inflection points of the membrane are determined so as to define, in the plane of the films, a boundary between the first and second regions.

According to a variant of the invention, the substrate comprises a cavity on all or part of the multilayer.

The elastic film may or may not be piezoelectric

According to a variant of the invention, the membrane comprises a first central region and two second lateral regions.

According to a variant of the invention, the membrane comprises two first lateral regions and a second central region.

According to a variant of the invention, one of the regions is central and the other region is on the periphery of the central region.

According to a variant of the invention, the process furthermore comprises the production of a buffer film, deposited on the elastic film, for promoting the production of the film of piezoelectric material.

According to a variant of the invention, the process furthermore comprises the production of an etch-stop film.

According to a variant of the invention, the membrane comprises a bottom electrode buried in the film of piezoelectric material in said first central region.

According to a variant of the invention, the membrane comprises elementary bottom electrodes buried in the film of piezoelectric material in the second region or regions.

According to a variant of the invention, the piezoelectric material is ferroelectric.

According to a variant of the invention, the ferroelectric material is of the PbZrTiO3 (PZT) or PbMgNbTiO3 (PMNT) or BaFeO3 (BST) or BaTiO3 or BiFeO3 type.

According to a variant of the invention, the piezoelectric material is an electrostrictive material.

According to a variant of the invention, the electrostrictive material of the SrTiO3, BaSrTiO3 or Pb(Mg,Nb)TiO3 type.

According to a variant of the invention, the elastic film is made of a silicon type material or a silicon compound (SiO2, SiN) or ZrO2.

According to a variant of the invention, the buffer film is made of ZrO2.

According to a variant of the invention, the structuring electrode film is produced by ion-beam etching.

According to a variant of the invention, the piezoelectric material is deposited using a sol-gel process.

According to a variant of the invention, the process furthermore comprises the deep etching of the substrate so as to define a cavity.

According to a variant of the invention, the process furthermore comprises locally etching the film of piezoelectric material so as to resume contact with the bottom electrode.

According to a variant of the invention, the film of piezoelectric material is etched with a chemical etch.

BRIEF DESCRIPTION OF THE DRAWINGS

The invention will be better understood, and other advantages will become clear, on reading the following description, given by way of non-limiting example, and by virtue of the appended figures in which:

FIG. 11 shows a variant of the invention having a buffer film and an etch-stop film;

FIGS. 12a and 12b show exemplary electrode geometries that may be used in a membrane according to the invention.

DETAILED DESCRIPTION

Figure 1:
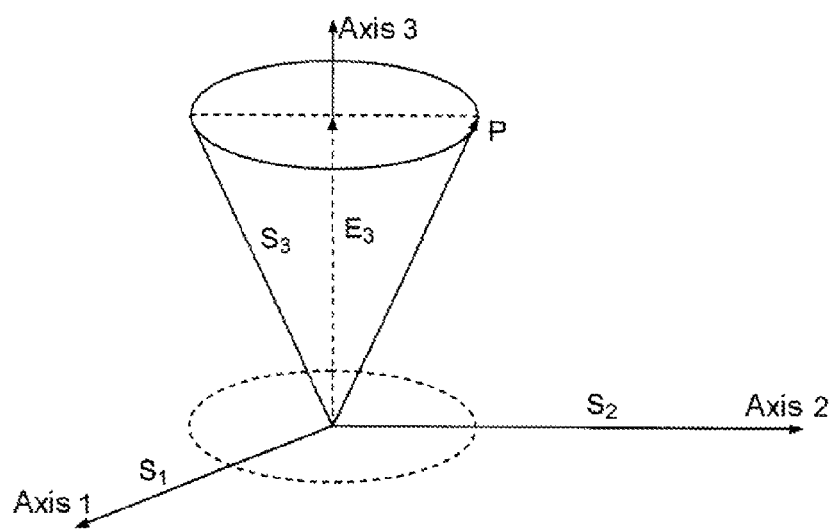
FIG. 1 shows the radial and longitudinal polarizations, $P_r$ and $P_3$, of a polarized material.
Figure 3:
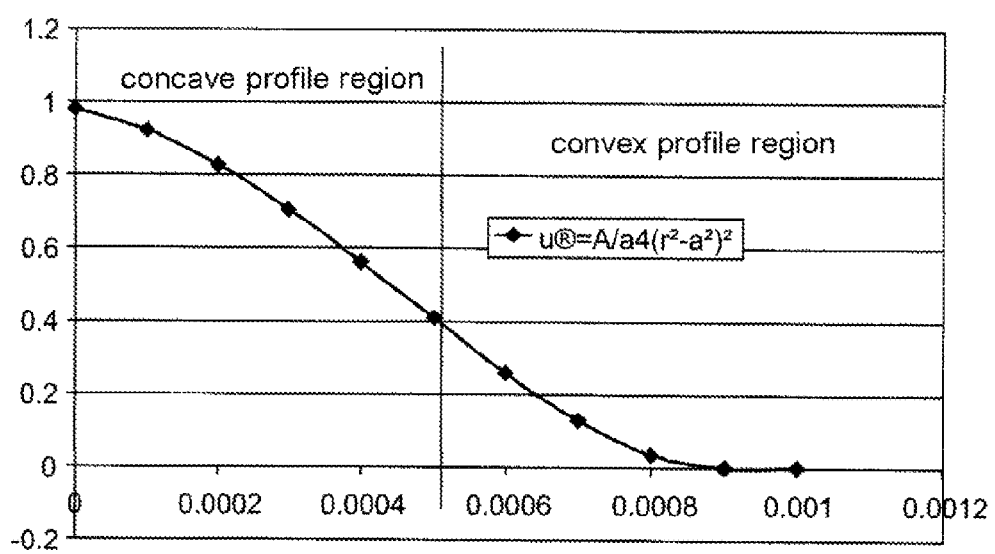
FIG. 3 shows the curvature profile of an actuated hybrid elastic film/piezoelectric film membrane according to the prior art.
Figure 2A:
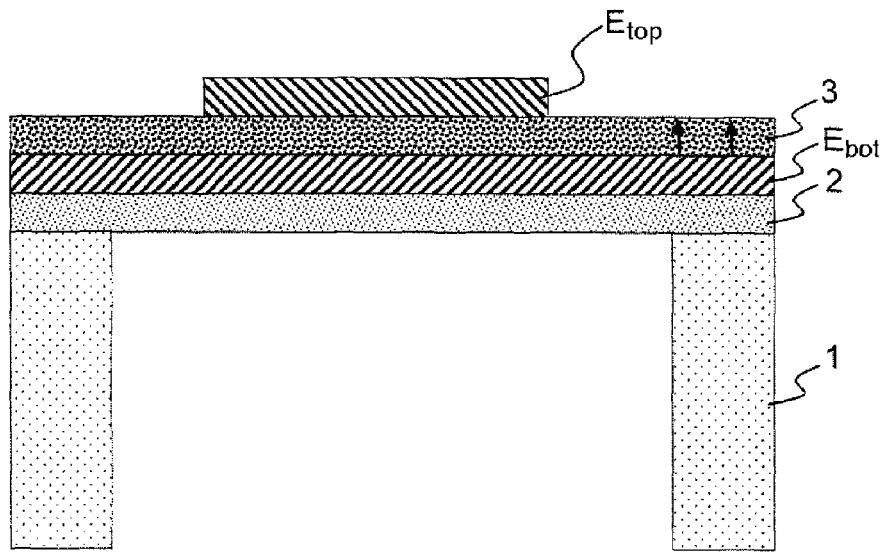
FIGS. 2a and 2b show two typical $d_{31}$ and $d_{33}$ actuating structures with membranes according to the prior art.
Figure 2B:
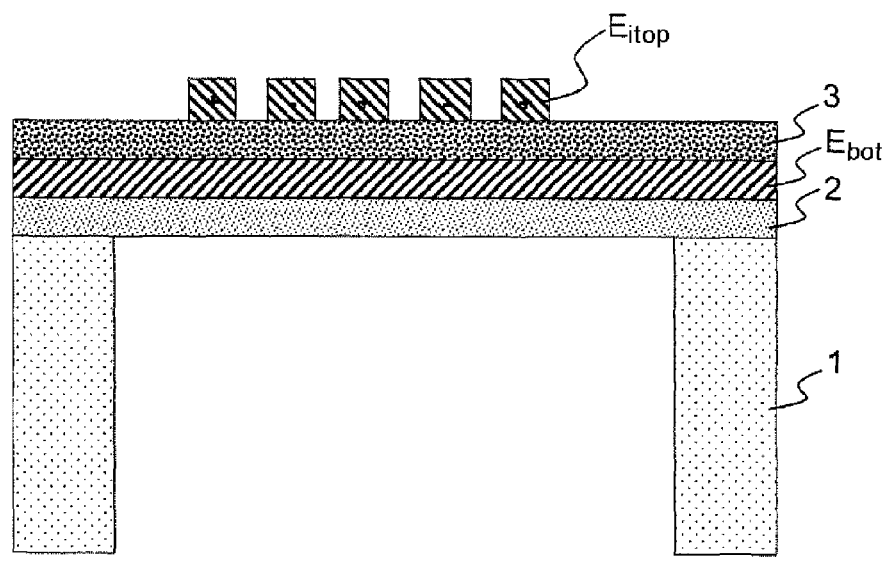
Figure 4A:
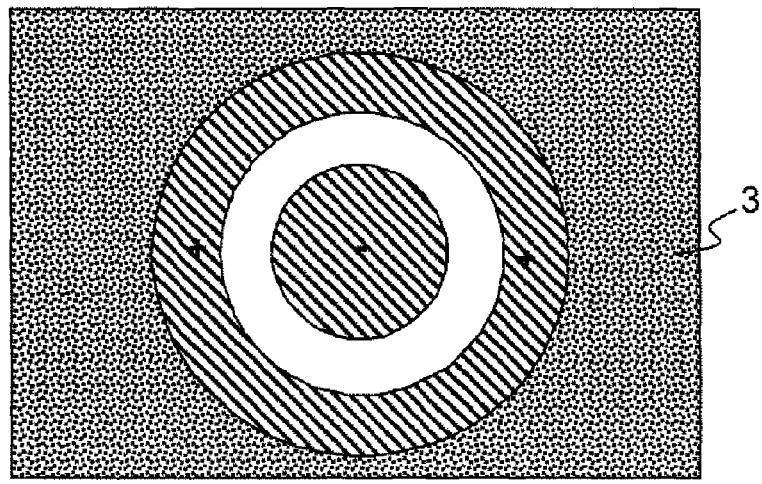
FIGS. 4a and 4b show, respectively, a top view and a cross-sectional view of a structure in which the two regions of different curvature of a membrane according to the prior art are excited simultaneously.
Figure 4B:
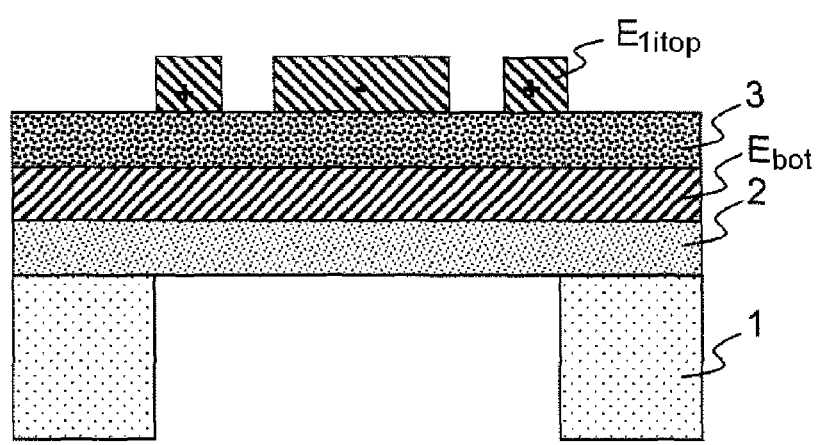

According to the invention, it is proposed to used a hybrid $d_{31}$ and $d_{33}$ actuation in the two regions of different curvature as shown in FIG. 3.

Because the d33 mode induces a positive strain coefficient Sp and the d31 mode induces a negative strain coefficient Sp it is therefore possible to produce piezoelectric in-plane strains of different sign, which is necessary to obtain an optimal deflection of the membrane.

To achieve this, and according to the invention, a curvature is determined that allows the inflection points, and thereby the limits of the actuators operating in d31 and the actuators operating in d33, to be defined.

Figure 5A:
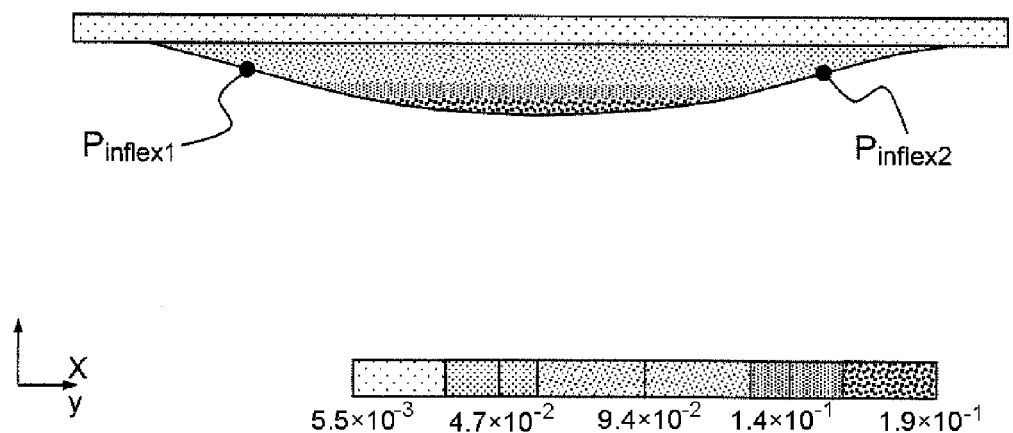
FIGS. 5a and 5b show the inflection points obtained in a process step of the invention allowing the boundary between the first and second regions to be defined in the case of a circular membrane.

One way of determining the curvature on which lie the inflection points is numerical simulation. For example, the software package Coventor, that outputs a simulated deflection of the structure of interest, as shown in FIG. 5a, in which the two inflection points Pinflex1 and Pinflex2 have been marked, may be used.

Figure 5B:
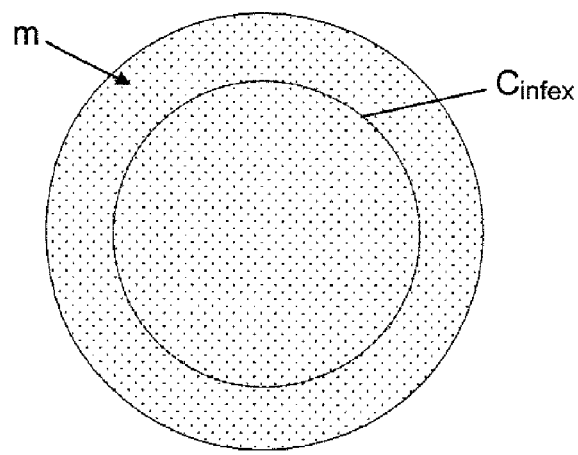

In FIG. 5b, it is demonstrated, for a circular membrane m, that all the inflection points may be joined to make an inflection point curve Cinflex.

This curve may be simulated but also calculated in the case of a simple membrane. However, when the structure is more complicated there is no longer an analytical solution and it is preferable to use a finite element model.

Figure 6A:
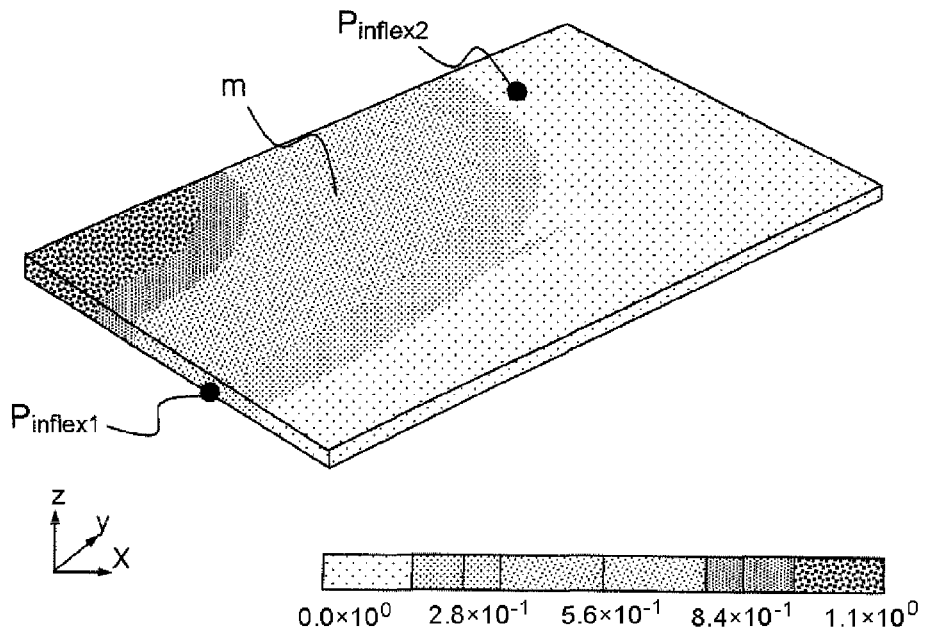
FIGS. 6a and 6b show the inflection points obtained in a process step of the invention allowing the boundary between the first and second regions to be defined in the case of a square or rectangular membrane.
Figure 6B:
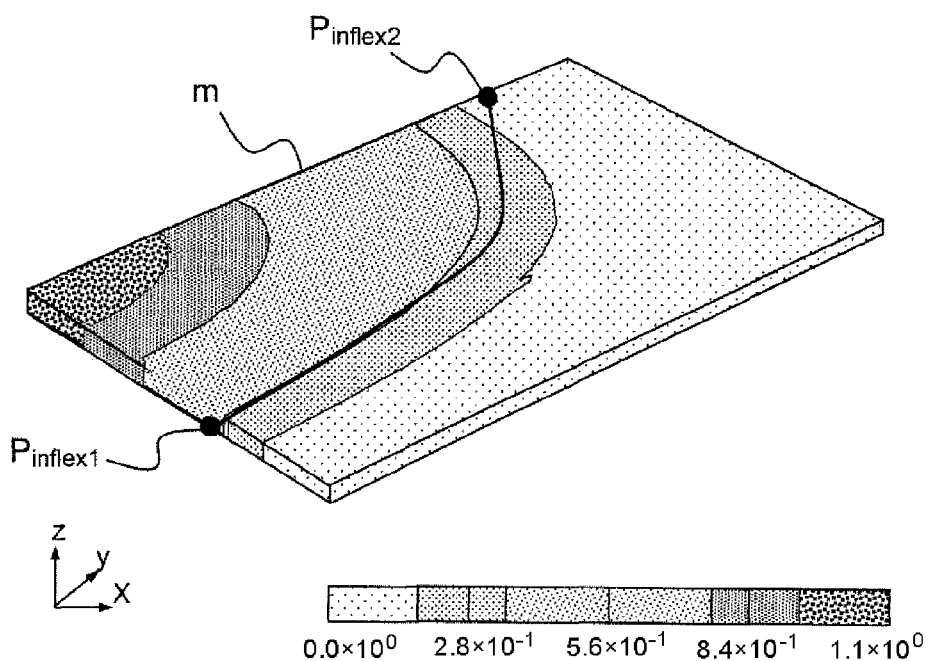

It is also possible to simulate square or rectangular structures as shown in FIGS. 6a and 6b. The inflection points Pinflex1 and Pinflex2, in the width and in the length of the structure, are apparent.

The membrane of the present invention may operate in high electric fields strengths, between the coercive and breakdown field strengths, with a ferroelectric piezoelectric material. It may also advantageously operate with an electrostrictive material of the $SiTiO3$, $BaSrTiO3$ or $Pb(Mg,Nb)TiO3$ type.

Figure 7:
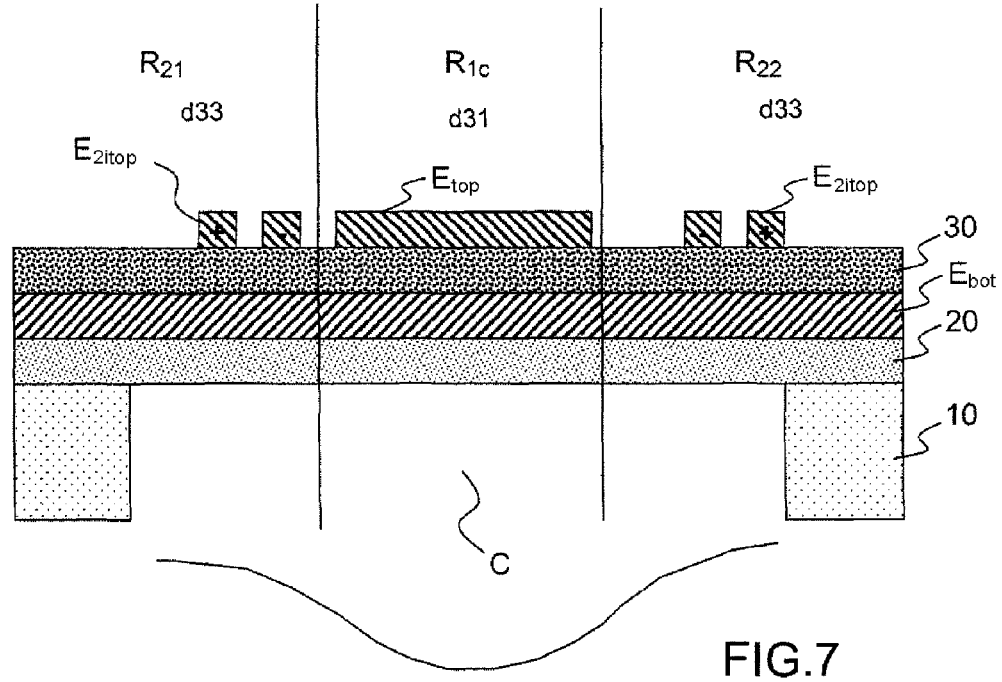
FIG. 7 shows a variant of the invention having a first central region and two second lateral regions.

FIG. 7 shows a first variant of the invention comprising a first central region R1C, that operates in the d31 mode, and two second lateral regions R21 and R22, that operate in the d33 mode, in a film of piezoelectric material 3 on the surface of an elastic film 20 deposited on the surface of a substrate 10 within which a cavity C is produced. The film of piezoelectric material moreover lies between a bottom electrode film Ebot and a top electrode film Eup so that field lines perpendicular to the plane of the films may be applied to the region R1c as shown by the arrows in said FIG. 7.

Figure 8:
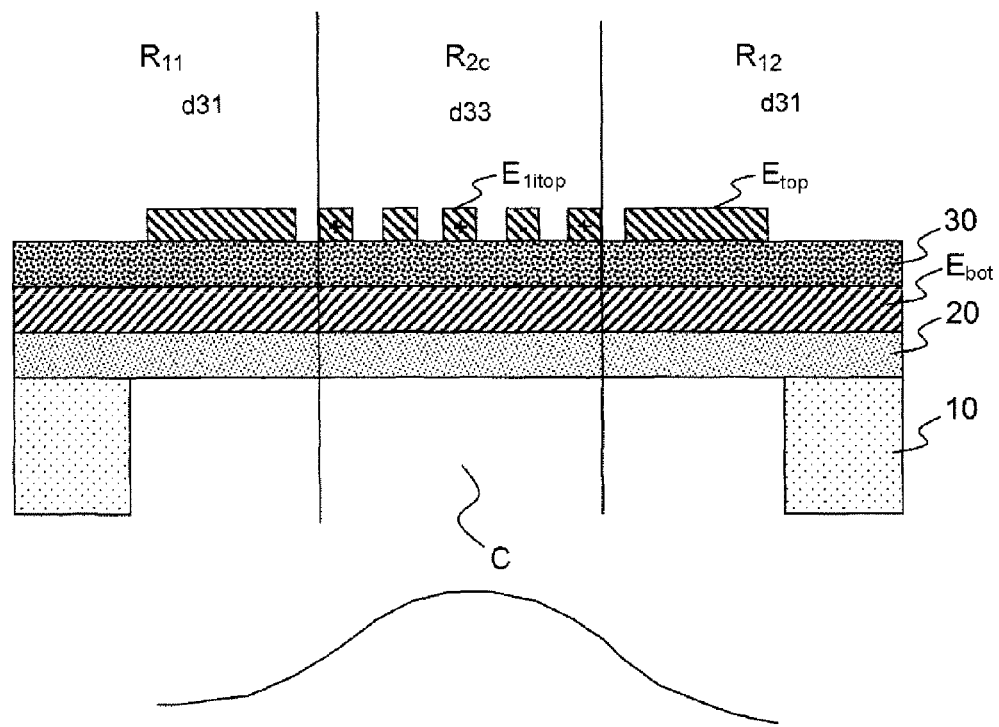
FIG. 8 shows a variant of the invention have a second central region and two first lateral regions.

According to another variant of the invention, the membrane structure as shown in FIG. 8 comprises a central $d_{33}$-mode region $R_{2c}$ and two lateral $d_{31}$-mode regions $R_{11}$ and $R_{12}$. The electrodes $E_{1itop}$ in the central region enable field lines parallel to the plane of the layers to be applied when the distance between the electrodes $E_{1itop}$ is less than the thickness of the film of piezoelectric material.

Figure 9:
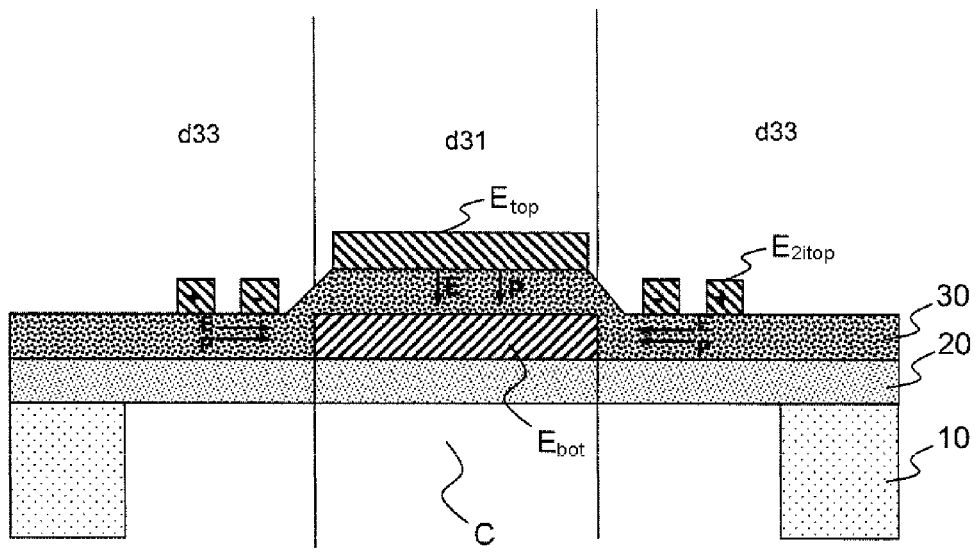
FIG. 9 shows a variant of the invention having a buried bottom electrode.

It is possible to optimize the operation of this type of structure. This is because, in the lateral regions in which the field lines are parallel to the plane of the films, it is advantageous not to distort too much when the horizontal field lines the bottom electrode is present. To this end, one variant of the invention proposes to omit, the bottom electrode in the second regions, as shown in FIG. 9, so as to be able to apply a horizontal electric field in the entire volume of the piezoelectric material in the d33 region.

It should be noted that the electric filed E must be sufficiently high to align the polarization in the direction of the field. In the d31 region in the centre of the membrane, as described above, the piezoelectric material induces a negative strain coefficient Sp when an electric field is applied. The membrane is therefore deflected downwards. In the d33-mode regions the piezoelectric material induces a positive strain coefficient Sp and the membrane therefore also has the tendency to be deflected downwards, in accordance with the reasoning illustrated by FIG. 3. This solution is also valid for electrostrictive materials.

Generally, the direction of the electric field is not important, whether in the d33 region or the d31 region. It is simply necessary to apply a field firstly between the bottom and top electrodes of the $d_{31}$ region and secondly between the "+" and "−" electrodes of the $d_{33}$ region.

It should be noted that the operation of this type of structure may also be optimized by making best use of all the piezoelectric material. This is because, in the lateral regions in which the field lines are parallel to the plane of the films, it is advantageous to avoid overly distorting the horizontal field lines by the presence of the bottom electrode whilst nevertheless exploiting all of the thickness of the film of piezoelectric material.

Thus, by placing the electrodes E2iup closer to each other the electric field may be concentrated, however this reduces the thickness of the piezoelectric material that can be used. Typically, the distance between the electrodes $E_{2iup}$ may be less than the thickness of the piezoelectric film.

Figure 10:
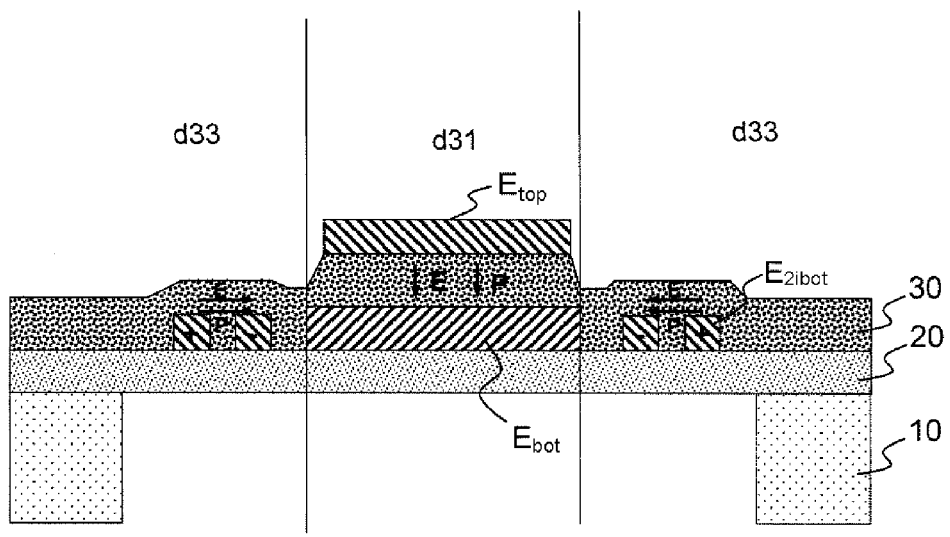
FIG. 10 shows a variant of the invention having several types of buried bottom electrode.

According to another variant of the invention, the bottom electrode may be structured into electrodes Ebot and E2i,bot rather than the top electrode Eup, as shown in FIG. 10. It is then necessary to etch locally the film of piezoelectric material to allow access to the buried electrodes.

According to a variant of the invention, it is proposed, as shown in FIG. 11, to add a buffer film 40 onto the elastic film so as to improve the growth of the PZT piezoelectric material and notably in the region without a bottom electrode. This is because conventionally the films of PZT piezoelectric material are grown, and it may be advantageous to deposit beforehand a film that promotes this growth. In the case of PZT deposition, this could be a $ZrO2$ film, particularly in the region beneath the bottom electrode.

Advantageously, nucleation films on the bottom electrode of the $TiO2$ or $PbTiO2$ type may also be used.

Moreover, to produce the membrane structure, generally the bottom side is etched and advantageously an etch-stop film 50 may also be provided for this etch.

A complete example of a multilayer and the production steps enabling the different sets of electrodes used in the present invention to be defined are given hereafter.

Exemplary Embodiment

An SOI substrate, typically with a 3 μm deep thin film of Si, was supplied;

a 400 nm thick $ZrO_2$ buffer film was deposited by reactive sputtering;

a bottom electrode film was produced by deposition of 100 nm of Pt by sputtering;

just before the platinum was deposited, a 20 nm thick film of $TiO_2$, serving as a tie film, was deposited by reactive sputtering;

the bottom electrode, made of platinum, was etched by ion beam etching;

a film of $Pb(Zr,Ti)O_3$ (PZT) piezoelectric material 1 μm thick was deposited by the sol-gel process followed by an anneal at 700° C.;

the PZT was etched by a wet chemical etch (HF/HCl) or by a dry etch (chlorinated gas/argon) for resuming contact with the bottom electrode;

the top electrode made of platinum 100 nm thick was deposited;

the top electrode was etched by ion beam etching so as to define the $d_{33}$ and $d_{31}$ regions; and lastly, the back side was etched, to free the membrane, with a deep $SF_6/C_4F_8$ etch according to a process of the prior art, until the buried SOI oxide etch-stop film was reached.

The geometry of the electrodes dedicated to the first and second regions may vary, FIGS. 12a and 12b showing an example of possible circular connections. The top view in FIG. 12a shows that a part of the electrodes E2itop/1 can be connected to one and the same first port P1 as the central electrode Eup, the other electrodes E2itop/2 being connected to a second port P2.

In this example, the bottom electrode is connected to the port P2. It should be noted that rectangular electrode geometries, typically 1 mm long, may equally well be envisaged.

Figure 13A:
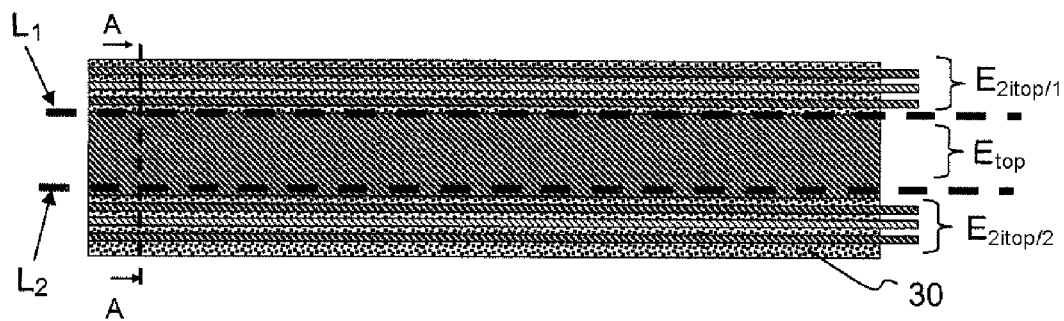
FIGS. 13a and 13b show an exemplary electrode geometry and exemplary lines of inflection points in the case of a very elongate membrane.
Figure 13B:
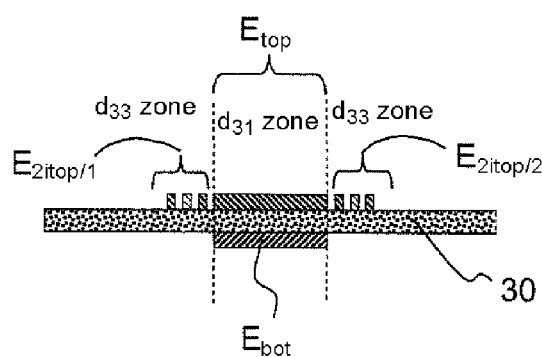

The rectangular membrane may also have a very high length-to-width ratio, as shown in FIGS. 13a and 13b, and it should be noted that in this case the inflection points are located on the two lines $L_1$ and $L_2$.

What is claimed is:

1. A process for fabricating a membrane comprising, on a substrate, a thin-film multilayer, said thin-film multilayer comprising a film of piezoelectric material placed between a top electrode film and a bottom electrode film and an elastic film for supporting said piezoelectric film, said process comprising:

determining at least one of concavity and convexity curvature of said membrane along an axis parallel to a plane of the films so that at least one inflection point is defined, said point allowing a first region and a second region, corresponding to a concave part and a convex part, or vice versa, to be isolated;

depositing, on the surface of the substrate, a thin-film multilayer comprising at least one film of piezoelectric material, one bottom electrode film and one top electrode film; and structuring at least one of the electrode films according to the said at least inflection point defined and so to define at least said first region, in which an electric field perpendicular to the plane of the films is applied, and at least said second region, in which an electric field parallel to the plane of the films is applied, wherein both a portion of the top electrode film and a portion of the bottom electrode film are present in the second region.

2. The process for fabricating a membrane according to claim 1, wherein all the inflection points of the membrane are determined so as to define, in the plane of the films, a boundary between the first and second regions.

3. The process for fabricating a membrane according to claim 1, wherein the substrate comprises a cavity on all or part of the multilayer.

4. The process for fabricating a membrane according to claim 1, wherein the membrane comprises a first central region and two second lateral regions.

5. The process for fabricating a membrane according to claim 4, wherein the membrane further comprises two first lateral regions and a second central region.

6. The process for fabricating a membrane according to claim 1, further comprising the production of a buffer film, deposited on the elastic film, for promoting the production of the film of piezoelectric material.

7. The process for fabricating a membrane according to claim 1, further comprising the production of an etch-stop film.

8. The process for fabricating a membrane according to claim 4, wherein the membrane comprises a bottom electrode buried in the film of piezoelectric material in said first central region.

9. The process for fabricating a membrane according to claim 1, wherein one of the regions is central and the other region is on the periphery of the central region.

10. The process for fabricating a membrane according to claim 1, wherein the membrane comprises a bottom electrode buried in the film of piezoelectric material in the second region or regions.

11. The process for fabricating a membrane according to claim 1, wherein the piezoelectric material is ferroelectric.

12. The process for fabricating a membrane according to claim 11, wherein the ferroelectric material is of the $PbZrTiO_3$ (PZT), $PbMgNbTiO_3$ (PMNT), $BaFeO_3$ (BST), $BaTiO_3$ or $BiFeO_3$ type.

13. The process for fabricating a membrane according to claim 1, wherein the piezoelectric material is an electrostrictive material.

14. The process for fabricating a membrane according to claim 13, wherein the electrostrictive material is of the $SrTiO_3$, $BaSrTiO_3$, or $Pb(Mg,Nb)TiO_3$ type.

15. The process for fabricating a membrane according to claim 1, wherein the elastic film is made of a silicon type material or a silicon compound ($SiO_2$, SiN) or $ZrO_2$.

16. The process for fabricating a membrane according to claim 15, wherein the buffer film is made of $ZrO_2$.

17. The process for fabricating a membrane according to claim 1, wherein the structuring of the electrode film is produced by ion-beam etching.

18. The process for fabricating a membrane according to claim 1, wherein the piezoelectric material is deposited using a sol-gel process.

19. The process for fabricating a membrane according to claim 1, further comprising the deep etching of the substrate so as to define a cavity.

20. The process for fabricating a membrane according to claim 19, further comprising locally etching the film of piezoelectric material so as to resume contact with the bottom electrode.

21. The process for fabricating a membrane according to claim 20, wherein the film of piezoelectric material is etched with a chemical etch.

22. The process for fabricating a membrane according to claim 1, comprising: structuring at least one of the electrode films in said second region so that a distance between elements formed by said structured electrode film in said second region is to be less than a thickness of said piezoelectric film.

* * * * *

UNITED STATES PATENT AND TRADEMARK OFFICE
CERTIFICATE OF CORRECTION

PATENT NO. : 9,190,599 B2  
APPLICATION NO. : 12/881955  
DATED : November 17, 2015  
INVENTOR(S) : Emmanuel Defay et al.

Page 1 of 1

It is certified that error appears in the above-identified patent and that said Letters Patent is hereby corrected as shown below:

In the claims:

Column 7,

In line 10 of claim 1, "said point" should be --said inflection point--.

In line 13 of claim 1, "a thin-film multilayer" should be --the thin-film multilayer--.

In lines 20 and 22 of claim 1, and in line 3 of claim 2, "films" should be --thin-film multilayer--.

Signed and Sealed this
Twenty-first Day of June, 2016

Michelle K. Lee
*Director of the United States Patent and Trademark Office*